US006570946B1

United States Patent
Homol et al.

(10) Patent No.: US 6,570,946 B1
(45) Date of Patent: May 27, 2003

(54) ONE-HOT DECODED PHASE SHIFT PRESCALER

(75) Inventors: David K. Homol, Apex, NC (US); Nikolaus Klemmer, Apex, NC (US); Al Jacoutot, Raleigh, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/432,623

(22) Filed: Nov. 3, 1999

(51) Int. Cl.[7] .............................................. H04L 25/40
(52) U.S. Cl. ...................... 375/371; 375/373; 375/375; 375/376; 327/113; 327/151; 327/152; 327/153; 327/160; 327/162
(58) Field of Search ................................. 375/371, 372, 375/373, 375, 376; 327/113, 155, 156, 159

(56) References Cited

PUBLICATIONS

Jan Craninckx and Michiel S.J. Steyart, *A 1.75–GHz/3–V Dual–Modulus divide–by–128/129 Prescaler in 0.7–μm CMOS*, IEEE Journal of solid–State Circuits, vol. 31, No. 7, pp. 890–897, Jul. 1996.

*Primary Examiner*—Don N. Vo
*Assistant Examiner*—Qutub Ghulamali
(74) *Attorney, Agent, or Firm*—Moore & Van Allen PLLC; Gregory Stephens (57) ABSTRACT

A prescaler (200) includes a first frequency divider (204, 206) configured to receive an input signal at an input frequency. The prescaler further includes a phase rotator (208) coupled to the first frequency divider to produce a plurality of signal phases in response to the input signal. A frequency control circuit (214) is configured as a one-hot decoder to select one signal phase of the plurality of signal phases. The one-hot decoder provides maximum speed of operation of the prescaler by eliminating decoding of the feedback signal.

10 Claims, 10 Drawing Sheets

FIG. 13

ONE-HOT DECODED PHASE SHIFT PRESCALER

BACKGROUND OF THE INVENTION

The present invention is generally related to frequency synthesis circuits. More particularly, the present invention is related to a dual-modulus prescaler using a one-hot decoded phase shift circuit.

Frequency synthesizers are an important building block of transceivers in radio devices. The frequency synthesizer is used to generate the local oscillator signal for demodulating received radio signals and modulating signals for transmission. For ideal performance of the transceiver, the frequency synthesizer and its component parts must operate at high precision. Since many modern radios are portable devices, small size and minimal current design are further design goals for a frequency synthesizer.

Figure 1:
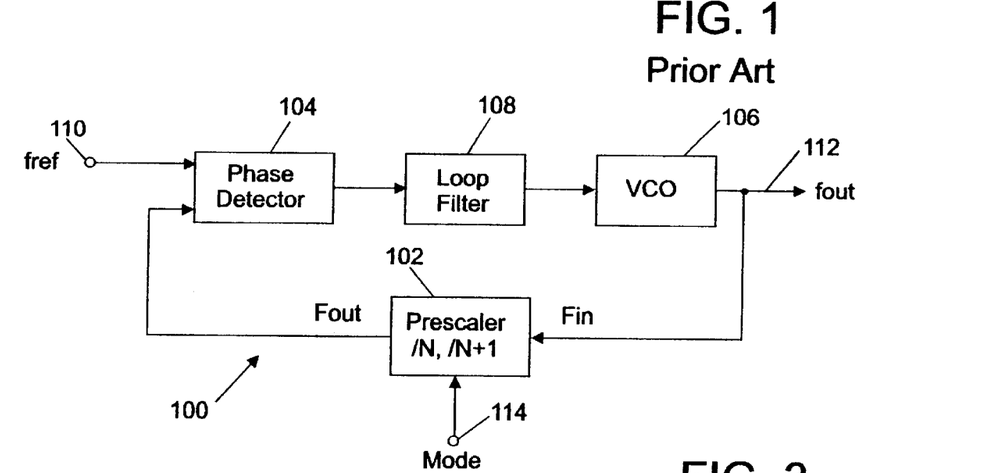
FIG. 1 is a block diagram of a conventional phase locked loop.

Conventional frequency synthesizers employ a phase locked loop (PLL), illustrated in FIG. 1, for tracking output frequency with an input, high precision oscillator frequency. Along with a prescaler 102, the PLL 100 typically includes a phase detector 104, a voltage controlled oscillator (VCO) 106 and a loop filter 108. A reference frequency labeled fref in FIG. 1 is received at an input 110 and the output signal at frequency fout is provided at an output 112. The prescaler 102 divides the frequency of the output signal from the VCO 106 by a variable division ratio to a certain low frequency. The low frequency signal is locked by the PLL 100 onto a very stable reference frequency, fref. A mode signal is provided at a mode input 114 of the prescaler 102 to select a modulus of division.

The prescaler 102 must include the logic necessary to select the desired modulus. The added dual modulus logic slows the operation of the prescaler 102 and even limits the upper frequency of operation of the prescaler 102 and the PLL 100. The prescaler 102 and the VCO 106 are the only blocks in the PLL 100 operating at the full frequency fout of the output signal. In a radio such as a cellular telephone, this frequency is in the range of 800 MHz and 2.0 GHz.

Figure 2:
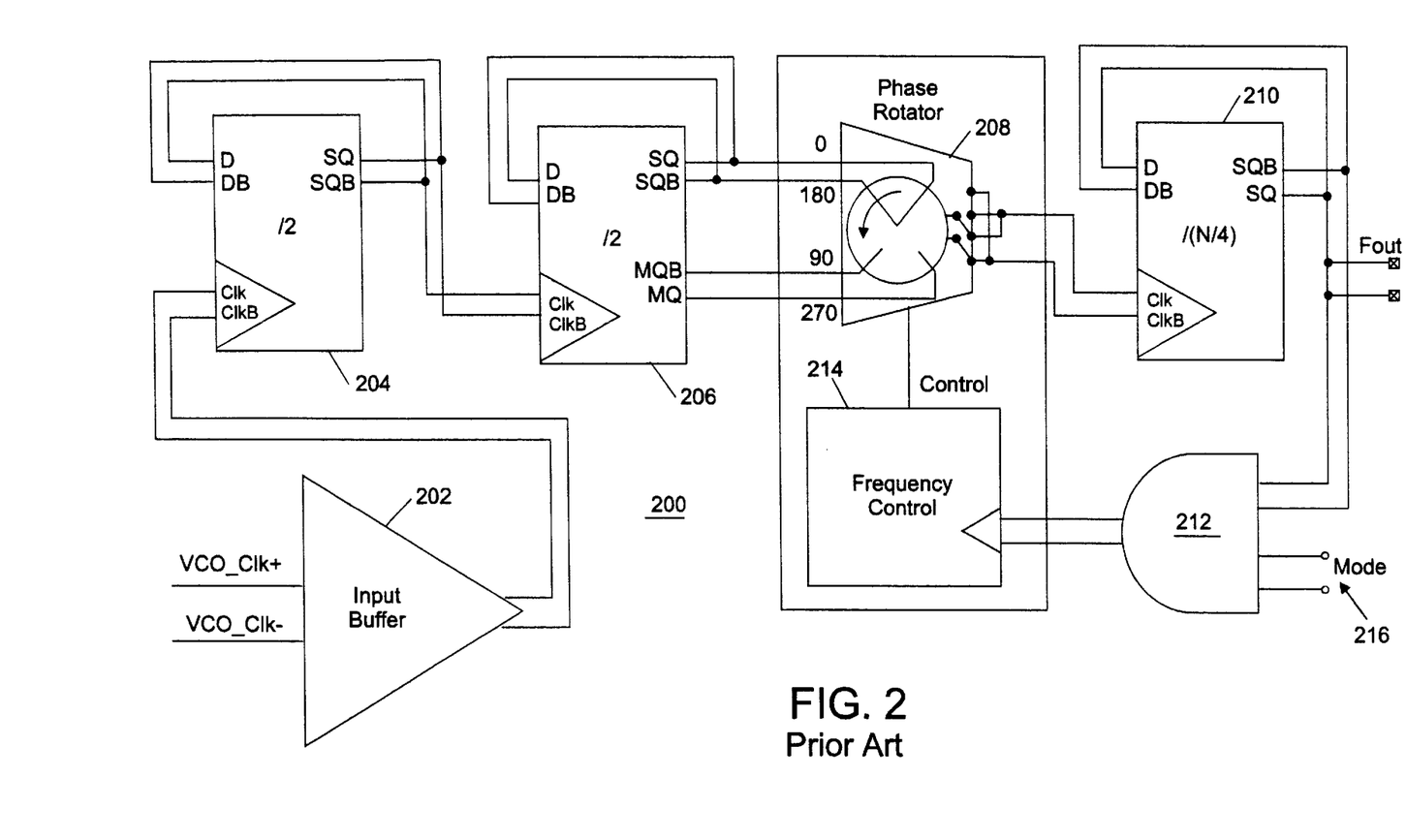
FIG. 2 is a prior art prescaler for use in the phase locked loop of FIG. 1.

One improved prescaler design has been proposed by Craninckx and Steyaert in 1.75 Ghz/3-V Dual-Modulus Divide-by-128/129 Prescaler in 0.7 $\mu$m CMOS, IEEE Journal of Solid-State Circuits, $\mu$ 31, no. 7, July 1996, page 890. FIG. 2 illustrates this prescaler 200.

The prescaler 200 includes an input buffer 202, a divide by two block 204, a divide by two block 206, a phase rotator 208, a divide by (n/4) block 210, a logic gate 212 and a frequency control circuit 214. The input buffer 202 receives a differential signal, labeled VCO_Clk+ and VCO_Clk− in FIG. 2. This signal is buffered to suitable logic levels and passed to a clock input of the divide by two block 204. The divide by two block 204 is any suitable divider such as a D-flip flop. The output of the divide by two block 204 is fed back to the input of the block 204 and also to the clock input of the divide by two block 206. The divide by two block 206 is configured as a master-slave flip flop and provides two differential output signals. The output signal of the slave flip flop is provided as the differential output labeled SQ and SQB in FIG. 2. This output signal is fed back to the input of the divide by two block 206, labeled D and DB. The output of the master flip flop is provided as the differential output labeled MQ and MQB in FIG. 2.

The four outputs from the master slave flip flop provide four quadrature signals. Each of the signals SQ, SQB, MQ and MQB is related to the input signal by a phase shift that is a multiple of 90 degrees. Thus, quadrature signals having phases 0 degrees, 90 degrees, 180 degrees and 270 degrees different from the input signal are available.

The phase rotator 208 selects one of the quadrature signals and passes the selected signal to the divide by (n/4) circuit 210. The selection is made based on an input signal from the frequency control circuit 214. This provides a divide by N operation. The output signal from the divide by (n/4) circuit 210 is the output signal from the prescaler 200. This output signal is passed to the logic gate 212, which is gated by a mode signal received at a mode input 216. Once a modulus or mode signal is provided to the mode input 216, an output edge signal from the divide by (n/4) circuit 210 provides a reference to switch phases for an N+1 division operation through the feedback path of logic. Thus, the mode signal disables and enables the feedback path to perform the needed N and N+1 frequency division ratio of the prescaler.

The feedback path of the phase shifting prescaler 200 is the critical path of this circuit. The feedback path includes the logic gate 212 and the frequency control circuit 214. The propagation delay through this circuit will limit the maximum operation frequency of the prescaler 200 and of any PLL and frequency synthesizer utilizing the prescaler 200.

Figure 3:
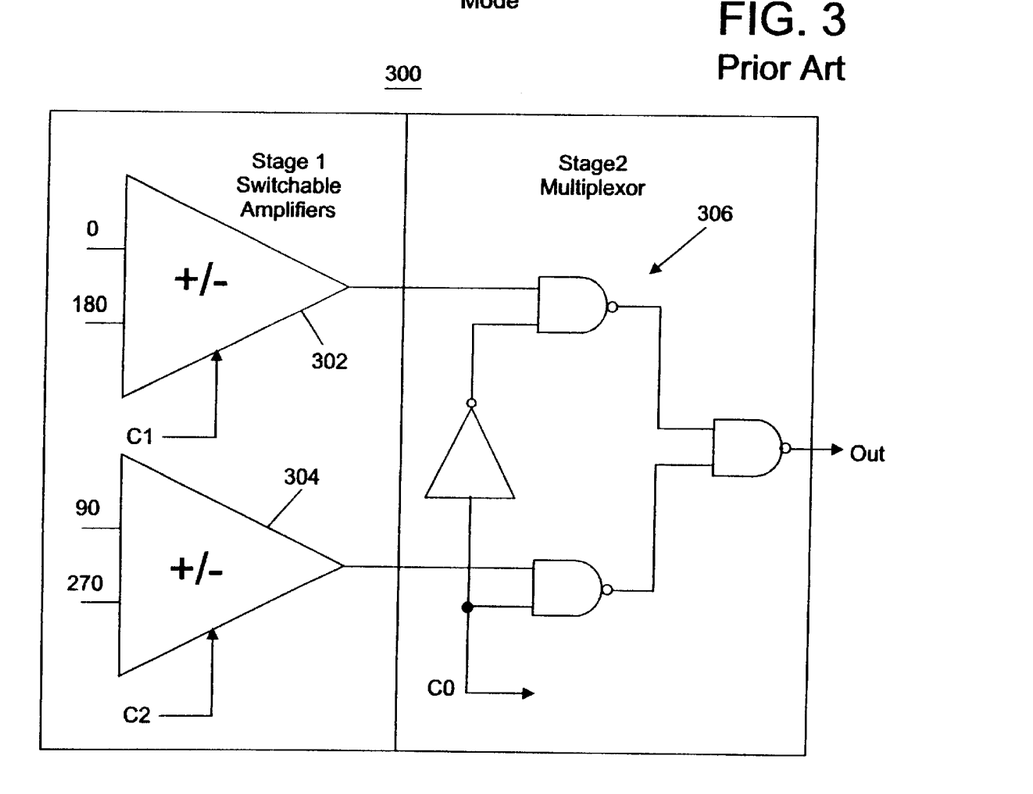
FIG. 3 is a prior art frequency control circuit for use in the prescaler of FIG. 2.

FIG. 3 illustrates one proposed circuit 300 for implementing the frequency control circuit 214. The circuit 300 includes a first switchable amplifier 302, a second switchable amplifier 304 and a multiplexer 306. By finding the sum or difference of the signals received at the switchable amplifiers 302, 304 the circuit 300 obtains the four necessary quadrature phase signals. To implement the proper sequence of signals for controlling the amplifiers 302, 304, the input signals labeled C1 and C2 are tied together to obtain 0 and 90 or 180 and 270 degree phase shifts of the intended signal. The control line labeled CO selects between the 0 or 90 and 180 or 270 degree phases of the intended signal. A two bit counter or other logic circuit is necessary in the feedback path for frequency control.

Figure 4:
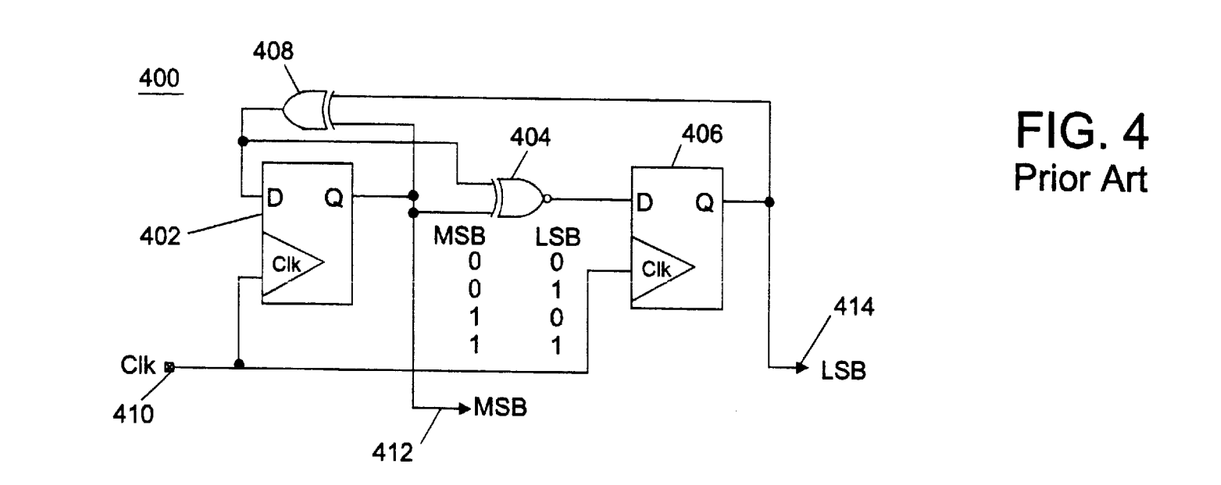
FIG. 4 is a two bit counter for controlling the frequency control circuit of FIG. 3.

FIG. 4 illustrates a two bit counter 400 suitable for controlling the frequency control circuit 300 of FIG. 3. The counter 400 includes a D flip flop 402, an exclusive OR gate 404, a D flip flop 406 and an exclusive OR gate 408. The counter receives a clock signal at an input 410 and provides a two bit output, including a most significant bit (MSB) at output 412 and least significant bit (LSB) at output 414. The table in FIG. 4 illustrates the counter sequence that allows phase shifting to occur in the control circuit 300 of FIG. 3 used in the prescaler 200 of FIG. 2.

Figure 5:
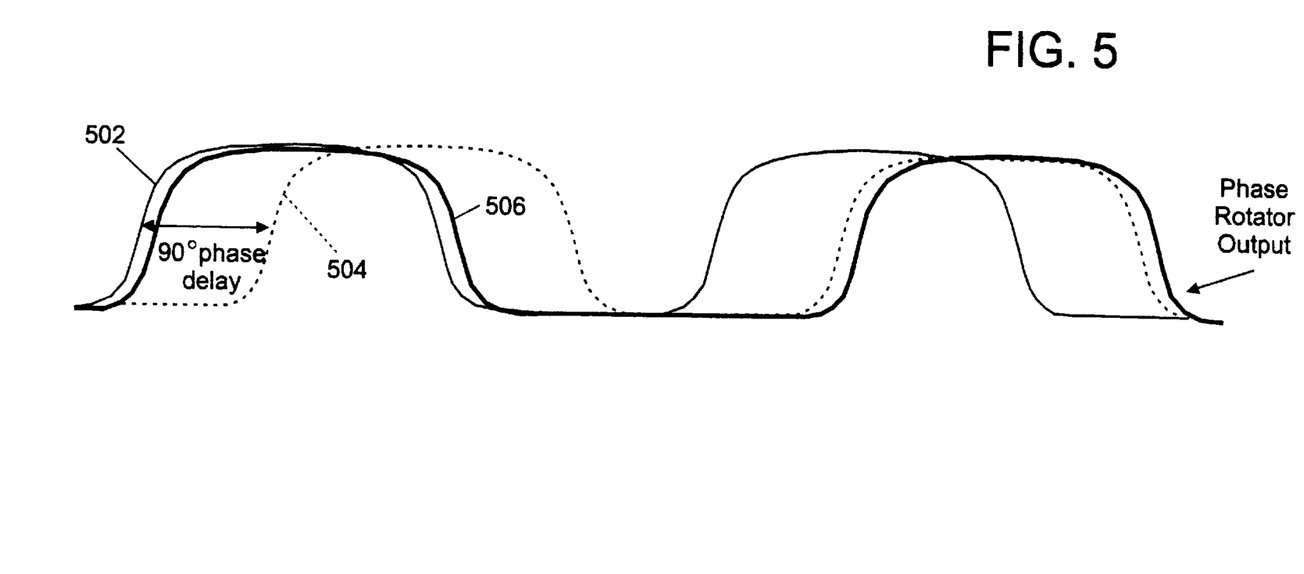
FIG. 5 is a plot of voltage versus time illustrating operation of the prescaler of FIG. 2.

FIG. 5 is a plot of voltage versus time displaying proper operation of the prescaler 200 using the circuit 300 and the counter 400 for a divide by N+1 operation. FIG. 5 shows a first signal 502 and a second signal 504 along with the output signal 506 of the PLL. The second signal 504 lags the first signal 502 by a 90 degree phase shift.

The major short coming of the circuitry of FIGS. 3 and 4 is a possibility of glitches on the output signal 506. This may be more properly referred to as a metastable state. A metastable state is a concern because its presence may cause an incorrect frequency division and will cause the PLL using the prescaler to become consistently unlocked from its designed local oscillator frequency. Also, metastability at the output of the switchable amplifiers 302, 304 of FIG. 3 could cause improper division by the divide by (n/4) circuit 210 in the prescaler 200 of FIG. 2. This results in a large amount of phase noise in the frequency synthesizer employing the prescaler 200.

Figure 6:
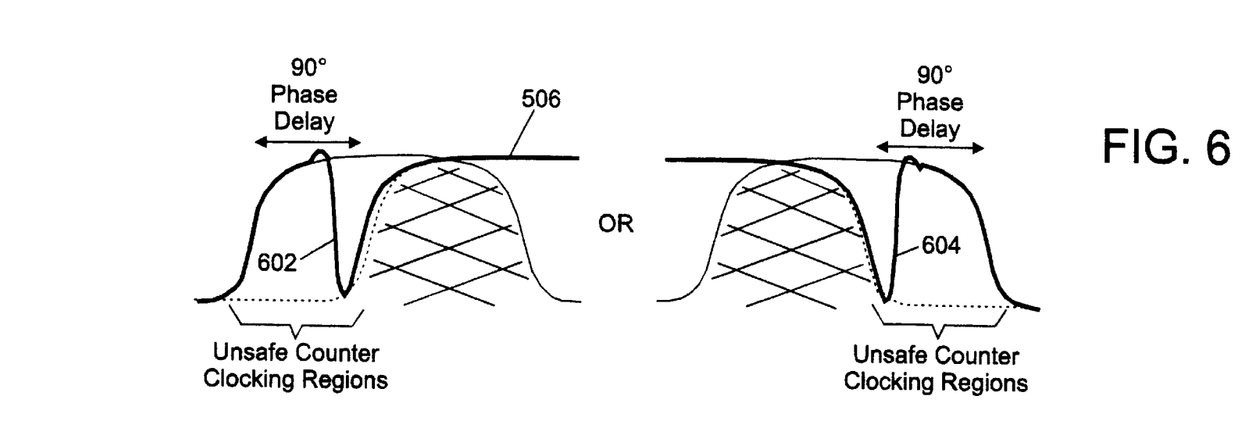
FIG. 6 is a plot of voltage versus time illustrating operation of the prescaler of FIG. 2 during the occurrence of a metastable state.

FIG. 6 is a plot of voltage versus time displaying signals of the prescaler 200 of FIG. 2 when a metastable state occurs. The metastable state occurs when the switchable amplifier 302, 304 switches abruptly in an unsafe switching region to cause metastability as shown in FIG. 6. The metastability is manifested as glitches 602, 604 in the output signal 506.

Figure 7:
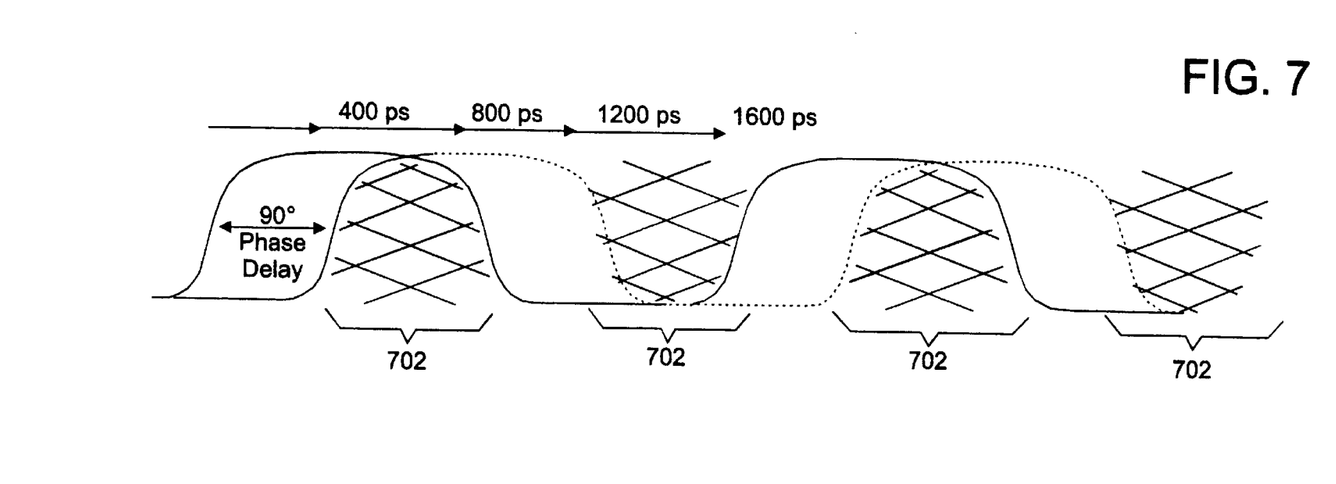
FIG. 7 is plot of voltage versus time illustrating operation of the prescaler of FIG. 2.

FIG. 7 is a plot of voltage versus time displaying signals of the prescaler 200 of FIG. 2. In FIG. 7 illustrates times when the phase shifting prescaler 200 may safely switch to avoid the metastable state. In the illustrated example, a prescaler operating at 2.5 GHz has a phase delay of 400 ps between each succeeding phase since the frequency has been divided by four prior to the phase rotator circuit 208 (FIG. 2).

Thus, the propagation delay through the divide by (n/4) circuit 210 (FIG. 1), frequency control circuit and both stages of the phase selection circuit 300 must be very well controlled to switch only during the safe counter clocking regions 702. However, this is a long chain of circuitry which inherently has a significant propagation delay. This makes phase switching within a safe counter clocking region 702 difficult to achieve and control. In a conventional CMOS process, the propagation delay of a single flip flop such as the flip flops 402, 406 used to implement the two bit counter 400 (FIG. 4) is 400 ps. This places a difficult constraint on avoiding metastability and achieving low current design.

Accordingly, there is a need for an improved prescaler which provides operation at least to 2 GHz while avoiding metastable states and providing low current operation.

BRIEF SUMMARY OF THE INVENTION

By way of introduction only, a prescaler in accordance with the present invention improves on the performance of previous phase shifting prescalers by employing a one-hot decoded phase control circuit. The one-hot circuit minimizes the propagation delay in the feedback loop of the prescaler. Further, enhancements to the design of the phase rotator and the logic circuit used in the feedback loop also increase the operational range of the prescaler.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 8:
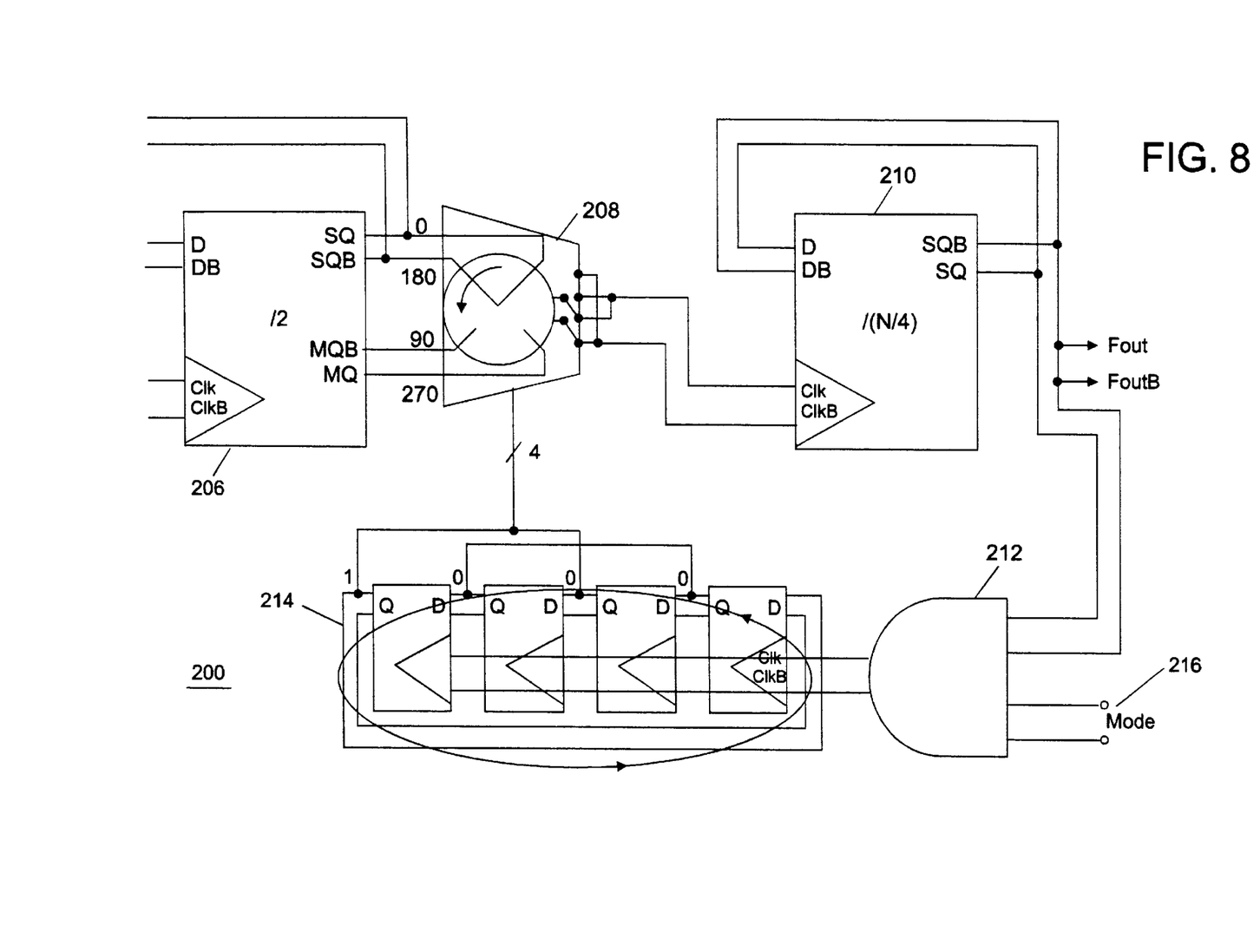
FIG. 8 is a block diagram of the prescaler of FIG. 2 modified in accordance with the present/invention.

Referring now to FIG. 8, it shows a block diagram of a portion of the prescaler 200 of FIG. 2 modified in accordance with the present invention. In FIG. 8, the portion of the prescaler 200 illustrated includes the divide-by-2 master-slave flip flop 206, the phase rotator 208, the divide-by-(n/4) circuit 210, the logic gate 212 and the frequency control circuit 214. The divide-by-2 circuit 206 forms a first frequency divider configured to receive an input signal at an input frequency. The phase rotator 208 is coupled to the first frequency divider to produce a plurality of signal phases in response to the input signal. The divide-by-(n/4) circuit 210 and the logic gate 212 form a feedback circuit.

In accordance with the present invention, the frequency control circuit 214 is implemented as a one-hot decoder to select one signal phase of the plurality of signal phases produced by the phase rotator 208. In a one-hot encoder or decoder, each bit position corresponds to a unique output value. One bit and no more than one bit must be active. The one-hot encoding or decoding scheme allows for a faster logic implementation which is crucial to operation of the prescalar 200.

There are a number of different state encoding methods. These include binary/sequential, gray, and one-hot. In binary or sequential coding, each state is assigned increasing binary numbers. For example, states 0 through 3 in binary encoding may be represented by the bit patterns 0000, 0001, 0010, 0011. In gray encoding, the states are encoded by assigning successive binary numbers where only one bit changes from one number to the next number. For the same example, the gray encoded sequence is 0001, 0010, 0100, 1000.

For one-hot encoding, each state is assigned its own flip flop, so n states requires n flip flops. Only one flip flop is in its true state at any one time. An example sequence is 0001, 0010, 0100, 1000.

Information about different coding types may be found in "HDL Chip Design, by D. J. Smith, published by Doone Publications in June 1996.

Binary or sequential coding has the advantage of being simple and intuitive. Gray coding has the advantage of only changing one bit at a time, thus reducing the likelihood of errors when transitioning between states. One-hot coding has the advantage of being very fast, since the decode is effectively done. The circuit only needs to determine which bit is on, as opposed to creating a logic decoder to determine the intent of the encoded value.

In FIG. 8, a phase rotator 208, one-hot decode frequency control circuit 214 and a simple AND gate 212 are used to implement reliable phase switching without metastability concerns for a low current design. Since the information needed to switch to the subsequent phase is within the timing of the frequency divider chain, the invention is referred to as a one-hot decoded rather than a one-hot encoded phase shift prescaler. Timing information is decoded via a one-hot decode to implement the phase shift operation.

Figure 9:
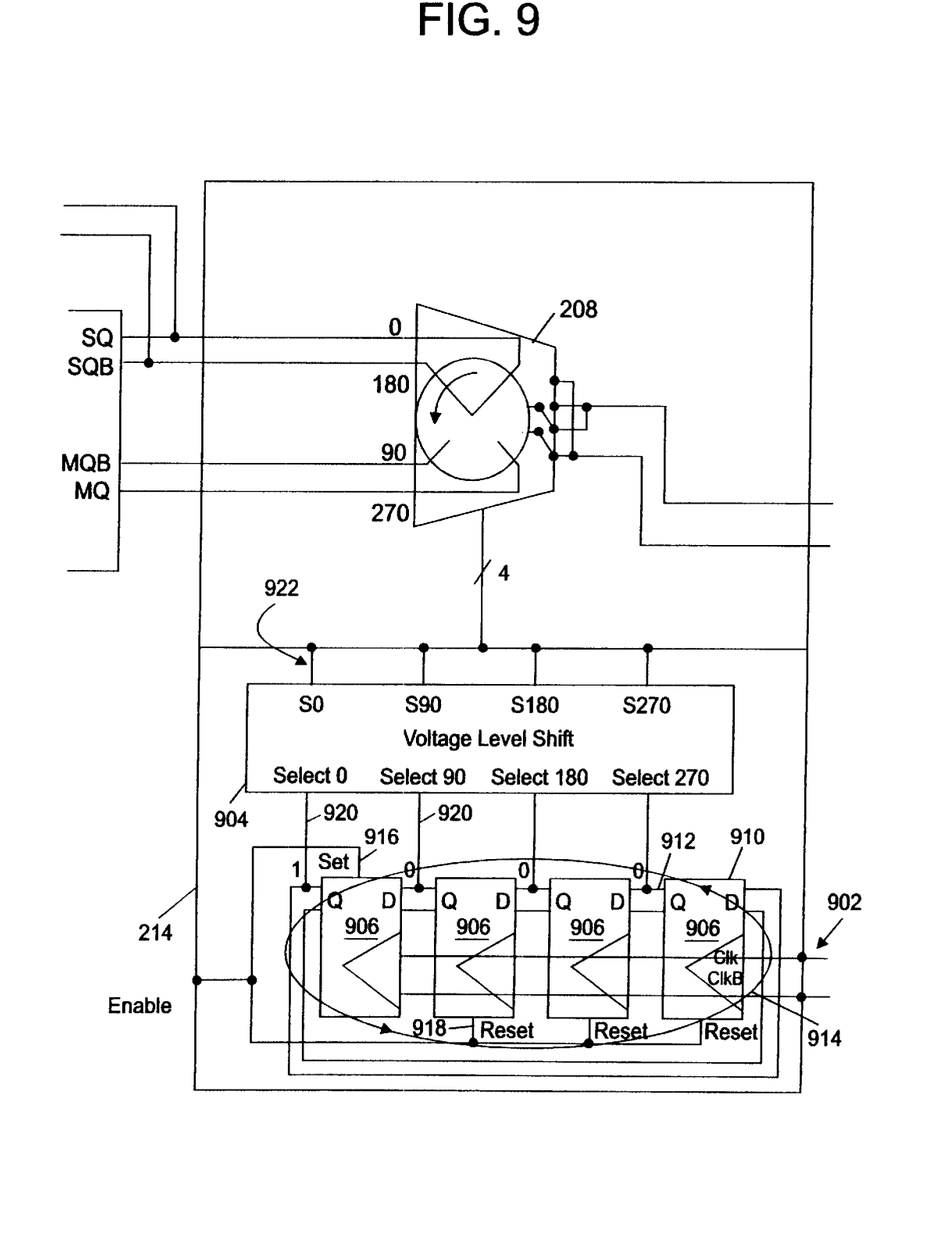
FIG. 9 is a more detailed view of a portion of FIG. 8.

FIG. 9 is a more detailed view of a portion of FIG. 8. In particular, FIG. 9 shows a more detailed view of the frequency control circuit 214. In the embodiment of FIG. 9, the frequency control circuit 214 includes one hot decoder 902 embodied as a plurality of flip flop circuits and a voltage level shift circuit 904. Each of the flip flop circuits is a D-type flip flop 906 having a differential data input 910 labelled D, a differential data output 912 labelled Q and a differential clock input 914 labelled Clk and ClkB.

In the embodiment of FIG. 9, at least one of the D flip flops has a set input 916 and the remainder of the D flip flops 906 have reset inputs 918. In the preferred embodiment, all of the D flip flops 906 are identical and have set and reset inputs which are controlled at the start of operation of the frequency control circuit 214 to initialize the state of the one-hot decoder 902. Differential signals are preferred for immunity to noise and fast switching, but single ended signals may be used. Similarly, D flip flops are used, but other types of data storage circuits may be used as well, including other flip flop or latch circuits, a data register, a first-in, first-out (FIFO) memory or any suitable type of data retention circuit.

The D flip flops 906 are coupled in series. That is, the data output 912 of each flip flop is coupled to the data input 910 of a next sequential D flip flop 906. The data output 912 of the final D flip flop 906 is fed back to the data input 910 of the first D flip flop 906. Thus, the plurality 902 of flip flop circuits forms an endless shift register. As each clock signal is received at the clock inputs 914 of the D flip flops 906, the data state from each D flip flop 906 is clocked to the next sequential D flip flop 906.

Through suitable use of the set input 916 of the at least one D flip flop 906 and the reset input 918 of the at least one D flip flop 906, the data state of the plurality of flip flop circuits 902 may be initialized to the data state illustrated in FIG. 9. Asserting the set input on the leftmost D flip flop 906 sets the data state of the D flip flop to a logic 1 value. Asserting the reset inputs on the remaining three flip flop circuits 906 resets the data state of those three flip flop circuits to a logic zero value. As a result, upon receipt of each clock signal at the clock input 914 of the D flip flops 906, the single logic 1 value in the D flip flops will move sequentially through the plurality of flip flops, as illustrated by the arrows in FIG. 9. Thus, one of the four flip flop circuits 906 of the one-hot decoder 902 will always have a logic 1 output. The remaining three will always have logic zero output signals.

The output 912 of each of the D flip flops 906 is coupled to an input of the voltage level shift circuit 904. The voltage level shift circuit 904 has four inputs 920 and four outputs 922. Each of the inputs 920 is coupled to an output of one of the four D flip flops 906. The four outputs 922 provide the control signal for phase rotator 208. The voltage level shift circuit 904 operates to provide an interface between the logic levels used by the plurality of flip flop circuits 902 and the phase rotator 208.

Figure 10:
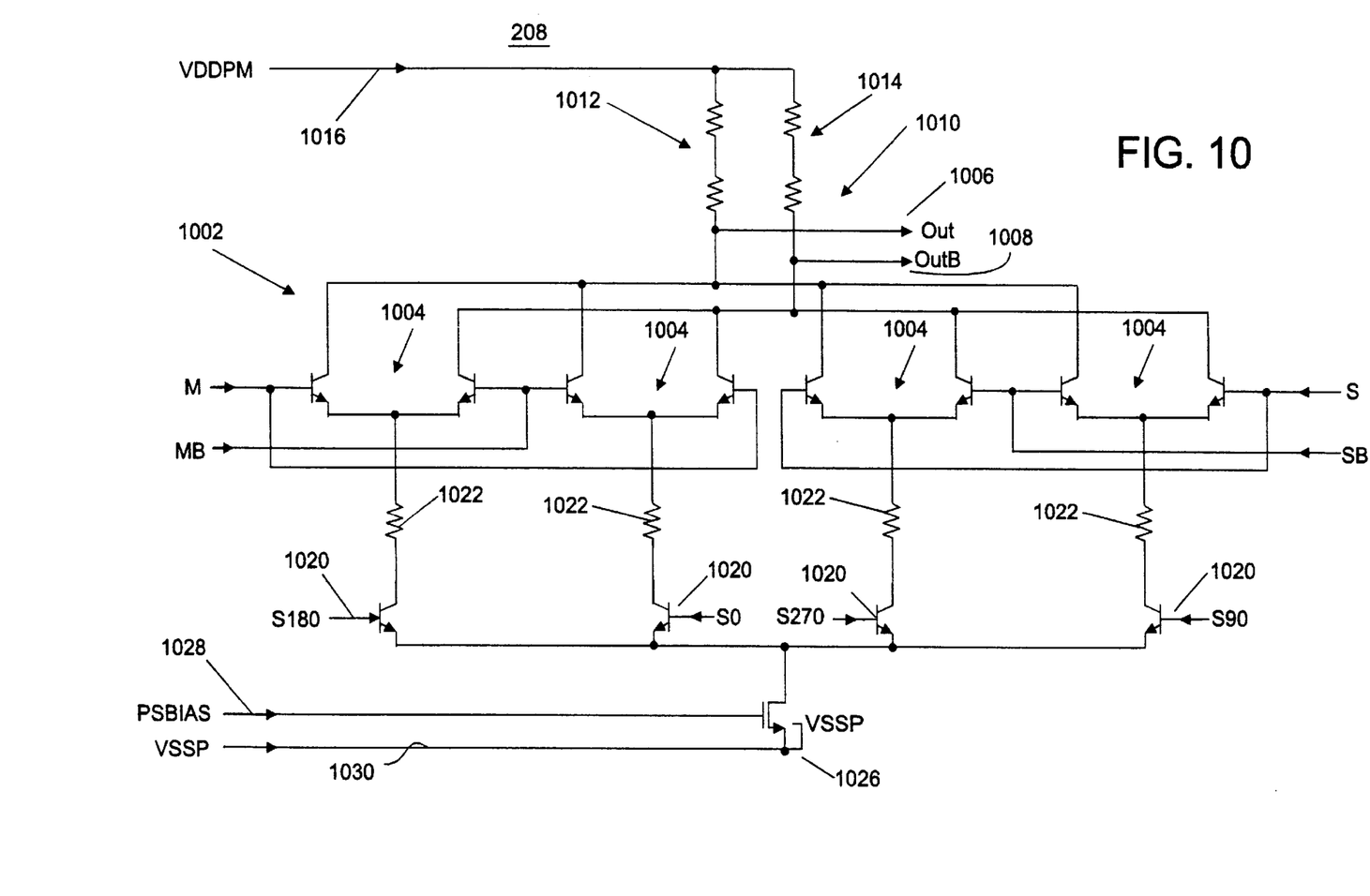
FIG. 10 is a circuit diagram of the phase rotator of FIG. 9.

FIG. 10 is a circuit diagram of the phase rotator 208 of FIG. 9. In the embodiment of FIG. 10, the phase rotator 208 comprises an emitter coupled logic (ECL) circuit formed of a plurality of bipolar transistors. The phase rotator 208 is configured as a two-level circuit. The upper level comprises a plurality 1002 of differentially coupled transistor pairs 1004. Each respective transistor of the plurality of transistor pairs is coupled to a respective output 1006, 1008 of a differential output 1010 of the phase rotator 208.

The inputs to the differentially coupled transistor pairs, their base terminals, are coupled to the master-slave latch outputs of the divide by two circuit 206 (FIG. 8). The divide by two circuit produces two differential outputs having a total of four signals, labeled SQ, SQB, MQ and MQB in FIG. 8. In FIG. 10, the corresponding signals are labeled S, SB, M and MB. The plurality 1002 of differentially coupled transistor pairs is arranged so that the left hand pair of differentially coupled transistor pairs 1004 combines the master latch output signals MQ and MQB and the right hand pair of transistors 1004 combines the slave latch output signals SQ and SQB. The collectors of corresponding transistors of the differentially coupled transistor pairs 1004 are combined or dotted to produce the differential output 1010. A resistor network 1012, 1014 is positioned between the differential outputs 1006, 1008 to provide a voltage drop from the power supply voltage, labeled VDDPW on node 1016.

The phase rotator 208 further includes a second level of transistors 1020. The collector of each of the transistors 1020 is coupled through a resistor 1022 to the common emitter nodes of one of the differentially coupled transistor pairs 1004. The transistors 1020 have a common emitter which is coupled to a current source transistor 1026. The current source transistor receives a bias voltage on a node 1028 and has a drain coupled to the negative power supply, labeled VSSP, on node 1030. Preferably, the bias voltage is compensated against variation in temperature and supply voltage. Suitable regulator circuits for generating the bias voltage are well known in the art.

The transistor 1026 forms a current source in response to the bias voltage on the node 1028. The current produced by the current source 1026 is steered through the two levels of logic in response to the input signals received at the transistors 1020 and the transistor pairs 1004. The steered current produces a voltage drop across one of the resistor networks 1012, 1014, and thereby produces an output signal on the differential output 1010.

Each of the transistors 1020 of the second level of transistors is coupled to one of the outputs of the voltage level shift circuit 904 (FIG. 9). Through the voltage level shift circuit 904, each of the transistors 1020 receives one of the select signals produced by the flip flop circuits 906 forming the one-hot decoder 902 of the frequency control circuit 214. Thus, one transistor 1020 receives a select signal labelled S180; one transistor 1020 receives a select signal labelled S0; one transistor 1020 receives a select signal labelled S270; and one transistor 1020 receives a select signal labelled S90. Each of the select signals is associated with one of the quadrature phase signals produced by the master-slave latch 206 (FIG. 8).

Only one of the select signals received at the base terminals of the transistors 1020 will be high at a given time, due to operation of the one-hot decoder 906 (FIG. 9). Thus, the transistors 1020 operate to determine or select which of the four signal phases received at the input nodes S, SB, M, MB will be active. The signals on those respective signal phase inputs will be coupled by the transistor pairs 1004 to the differential output 1010.

Thus, the phase rotator circuit 208, in conjunction with the master-slave latch 206, operates to produce a plurality of signal phases in response to the input signal of the prescalar while selecting one signal phase in response to the frequency control signal received from the frequency control circuit 214. As the single logic 1 bit in the one-hot decoder 902 moves around the D flip flops 906 (FIG. 9) in response to the feedback signal, one of the inputs S180, S80, S270, S90 receives the logic 1 value and becomes active to select the specified phase of the quadrature phase signal received by the phase rotator 208.

Figure 11:
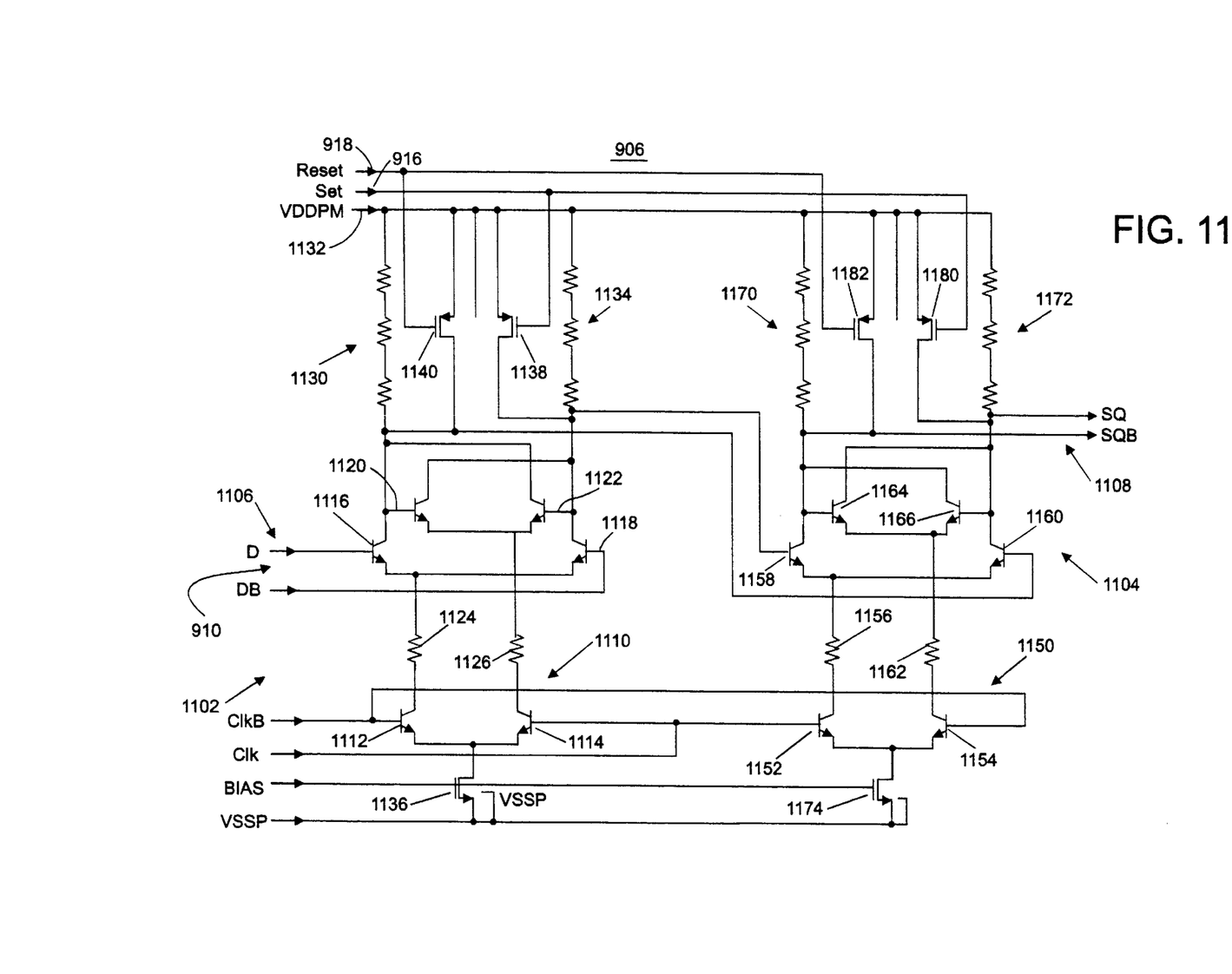
FIG. 11 is a circuit diagram of a D flip flop for use in the frequency control circuit of FIG. 9.

FIG. 11 is a circuit diagram of a D flip flop 906 for use in the frequency control circuit 914 of FIG. 9. The D flip flop 906 includes a master latch 1102 and a slave latch 1104. The two latches are generally identical in structure and operation. The master latch 1102 has a differential input 1106 for receiving the data or D signal and its complement labeled DB. The slave latch 1104 has a differential output 1108 for providing the data out signal, labeled SQ and SQB in FIG. 11.

Each latch 1102, 1104 has two levels of logic. The master latch 1102 has a first level of logic 1110 including a differentially coupled pair of transistors 1112, 1114. These transistors receive the differential clock signal labeled CLK and CLKB. The master latch 1102 includes a second level of logic including differentially coupled transistors 1116, 1118 and cross-coupled transistors 1120, 1122. The emitters of the transistors 1116, 1118 are common and connected through a resistor 1124 to the collector of transistor 1112. Similarly, the emitters of the cross-coupled transistors 1120, 1122 are common and connected through a resistor 1126 to the collector of transistor 1114.

The bases of the transistors 1116, 1118 are coupled to the data input 910 of the flip flop 906 and receive the differential data input signal, labeled D and DB. The bases of the cross-coupled transistors 1120, 1122 are coupled respectively to collectors of the transistors 1116, 1118. The cross-coupling provides a latching operation. The collector of the transistor 1122 is coupled to the collector of the transistor 1116. Similarly, the collector of the transistor 1120 is coupled to the collector of the transistor 1118.

A resistor network 1130 is located between the collector of the transistor 1116 and the collector of the transistor 1122 and the positive supply node 1132. Similarly, a resistor network 1134 is located between the collector of the transistor 1118 and the collector of the transistor 1120. These resistor networks 1122, 1134 provide a voltage drop from the positive supply node 1132 when current is steered through the respective resistor networks. The master latch 1102 includes a current source transistor 1136 which generates a current in response to a bias voltage on a bias node labeled BIAS. Preferably, the bias voltage is compensated against variation in temperature and supply voltage.

The master latch 1102 further includes a set transistor 1138 and a reset transistor 1140. In response to signals asserted on the set input 916, the set transistor 1138 operates to set the master latch 1102 to a predetermined state. Similarly, in response to a reset signal on the reset input 918, the reset transistor 1140 operates to reset the master latch 1102 to a predetermined state.

The slave latch 1104 is configured and operates similarly to the master latch 1102. The slave latch 1104 includes a first level of logic 1150 including a transistor 1152 and a transistor 1154. The transistors 1152, 1154 are differentially coupled and receive the differential clock signal on nodes labeled CLK and CLKB. The transistor 1152 is coupled through a resistor 1156 to a differentially coupled pair of transistors including a transistor 1158 and a transistor 1160. The transistor 1154 is coupled through a resistor 1162 to a differentially coupled pair of transistors, including transistor 1164 and transistor 1166. The transistors 1158, 1160 have base terminals connected to the differential output of the master latch. The transistors 1164, 1166 are cross-coupled with the transistors 1158, 1160 to provide a latching operation for the slave latch 1104.

A resistor network 1170 is positioned between the collectors of the transistor 1158 and a transistor 1166 and the positive supply node VDDPW. Similarly, a resistor 1172 is positioned between the collectors of the transistor 1160 and the transistor 1164 and the positive supply node VDDPW. The slave latch 1104 includes a current source transistor 1174 which supplies a current in response to a bias voltage on the node labeled BIAS. The slave latch 1104 further includes a set transistor 1180 and a reset transistor 1182. These transistors operate to set and reset, respectively, the data state of the slave latch 1104 in response to signals asserted at the set input 916 and the reset input 918.

Figure 12:
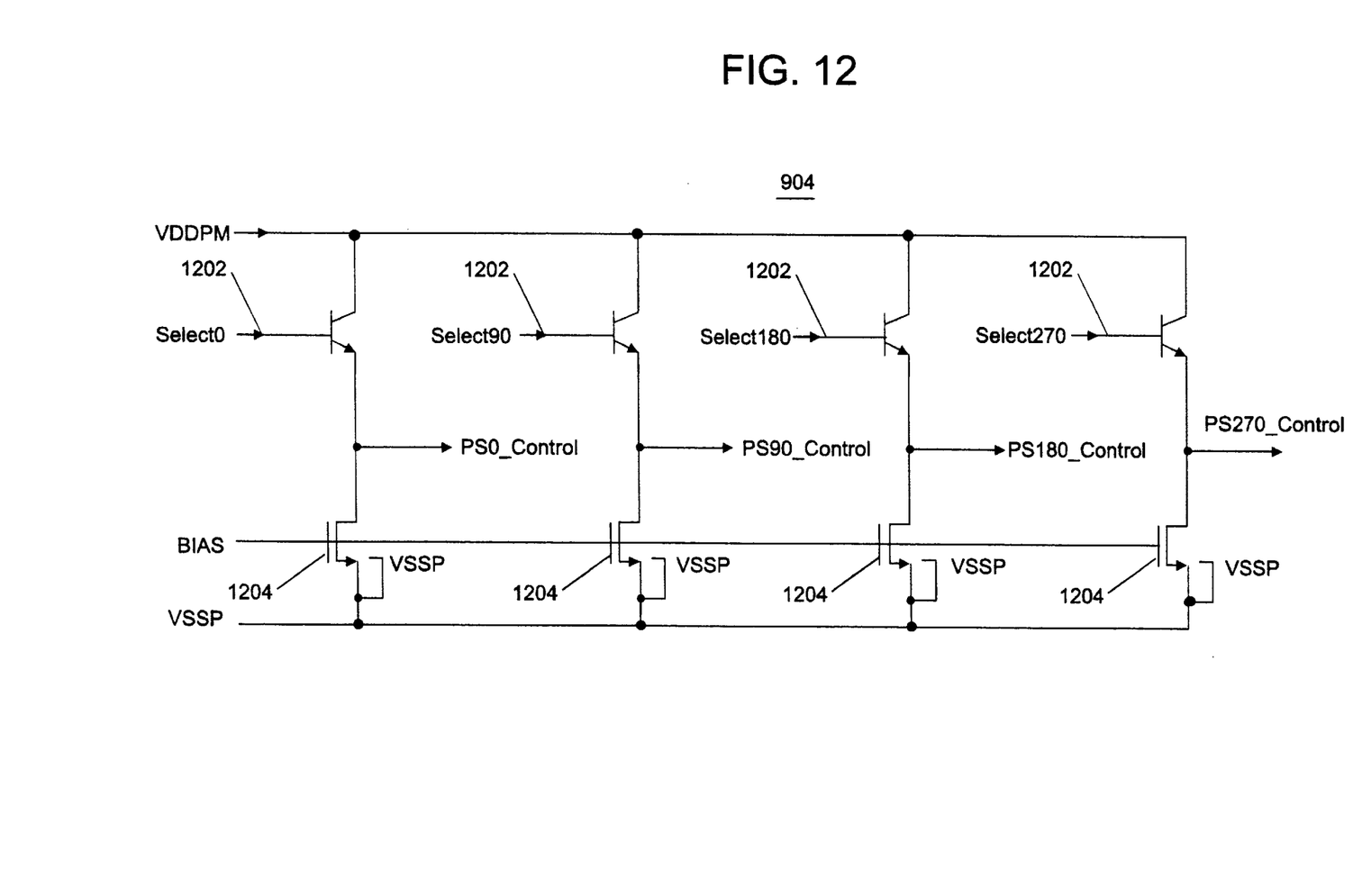
FIG. 12 is a circuit diagram of a level shifter circuit for use in the prescaler circuit of FIG. 2

FIG. 12 is a circuit diagram of a level shift circuit 904 for use in the prescaler circuit 200 of FIG. 9. The voltage level shifter circuit 904 operates to shift the voltage levels produced by the D flip flops 906 to levels suitable for controlling operation of the phase rotator 208.

The voltage shift circuit 904 includes four level shift transistors 1202 and four current source transistors 1204. The current source transistors 1204 form four respective current sources in response to a bias voltage on the node labeled BIAS in FIG. 12. Each current produced by the current source transistors 1204 is provided to one of the level shift transistors 1202. The transistors 1202 each have a base terminal configured for coupling to an output of one of the D flip flops of the frequency control circuit 214 and an emitter coupled to the drain of the current source transistor 1204 and an input of the phase rotator circuit 208. Thus, the transistors 1202 operate to shift the voltage at the D flip flop circuits 906 downward by a base-emitter voltage for compatibility with the input of the base rotator circuit 208.

Figure 13:
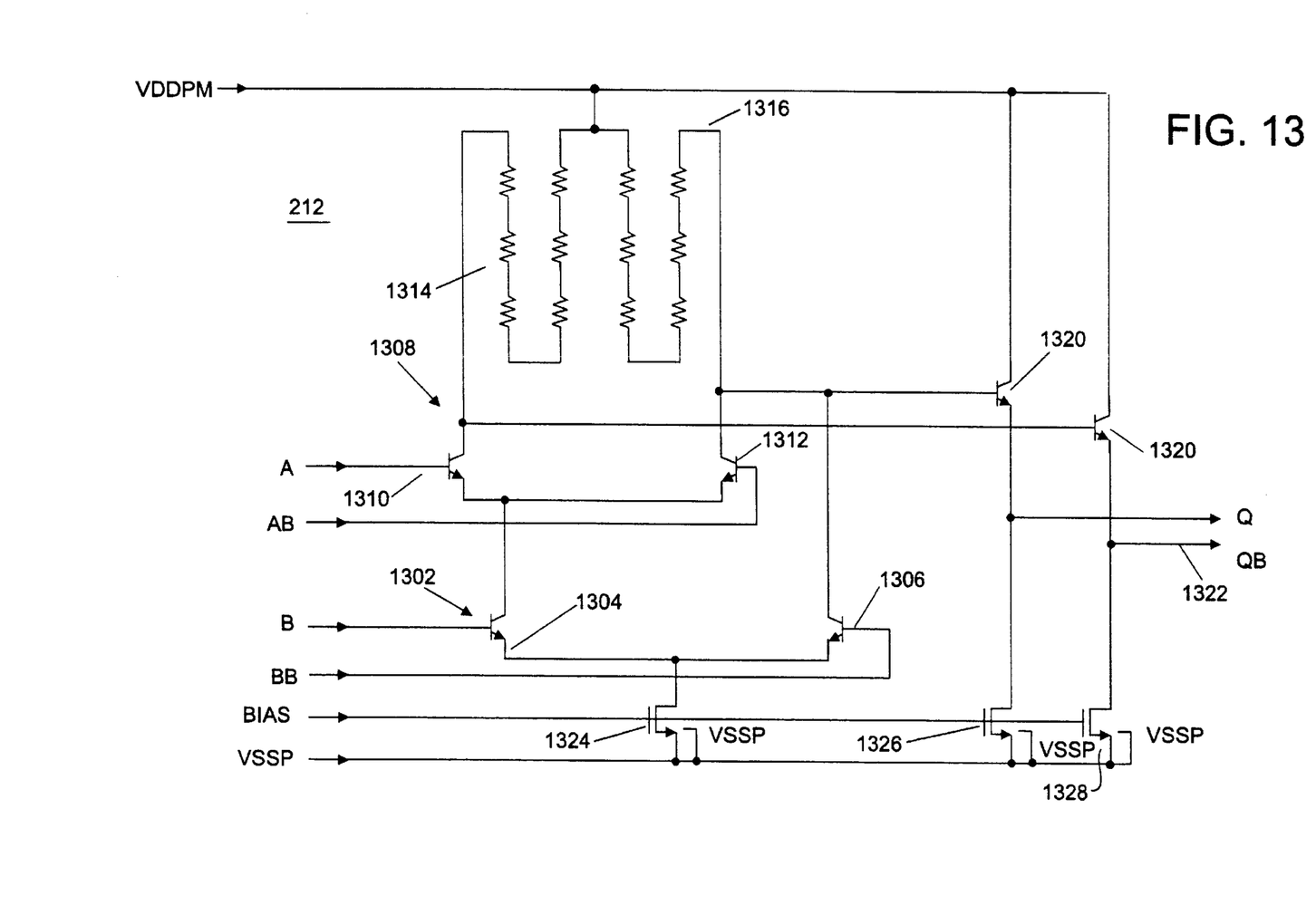
FIG. 13 is a circuit diagram of an AND gate for use in the prescaler circuit of FIG. 2.

FIG. 13 is a circuit diagram of an AND gate 212 for use in the prescaler of FIG. 9. The AND gate 212 performs the logic function A AND B where A and B are differential binary signals. In the implementation of FIG. 2, the AND gate 212 logically combines the feedback signal from the output of the prescaler 200 and the mode signal. In the AND gate 212, the mode signal operates as an enable signal for enabling the feedback operation of the prescaler 200.

The AND gate 212 is arranged as two levels of logic. On a first logic level 1302, a transistor 1304 and a transistor 1306 receive the signal B and its complement BB. Transistors 1304 and 1306 are differentially coupled. A second logic level 1308, a transistor 1310 and a transistor 1312 receive the A signal and its complement AB. Transistors 1310, 1312 are differentially coupled. The collector of the transistor 1304 is coupled to the common emitter node of the transistors 1310, 1312.

A resistor network 1314 is located between the collector of the transistor 1310 and positive supply node labeled VDDPW. Similarly, a resistor network 1316 is located between the collector of the transistor 1312 and the positive supply node VDDPW. The collector of the transistor 1306 is coupled to the collector of the transistor 1312.

A pair of level shifting transistors 1320 are coupled between the collectors of the transistors 1310, 1312 respectively. The emitters of the transistors are coupled to the differential output 1322 of the AND gate 212. The AND gate 212 further includes current source transistors. A first current source transistor 1324 provides operational current for the logic circuitry including transistors 1304, 1306 and transistors 1310, 1312. Current source transistors 1326 and 1328 provide operational current for the level shifting transistors 1320. The current source transistors 1324, 1326, 1528 provide output current in response to a bias voltage on a node labeled BIAS in FIG. 13.

The circuit diagrams of FIGS. 10–13 show embodiment of the circuits therein as bipolar or BiCMOS circuits. The positive supply voltage supplied to these circuits is in the range of 3 to 5 volts, but may be otherwise. Preferably, the supply voltage is reduced to reduce power dissipation in the circuit while maintaining the desired operational performance. Device sizes and bias currents may be chosen in accordance with the integrated circuit fabrication technology available, and will vary depending on the performance requirements of the circuit. Further preferably, the circuits of FIGS. 10–13 are combined in a single integrated circuit to improve the speed and power performance of the overall circuit. However, other suitable partitioning may be implemented. It is to be understood that other circuit topologies and other circuit technologies may be substituted for those illustrated in the drawing.

From the foregoing, it can be seen that the present invention provides an improved prescaler operational at very high frequencies while avoiding metastable states. The design has very low complexity, and includes only a simple phase rotator, an ECL AND gate and a flip flop with set, reset, and level shift. In the feedback path, no ECL to CMOS circuitry is needed. The four flip flop and level shift circuits are all copies of a single circuit, reducing complexity. The topology of the circuit is all differential, therefore improving the noise immunity of the circuit. The circuit provides accurate control of precise transitions due to well-defined timing, with the chosen topology having very fast slew rates. Since the phase selection design is implemented via a bipolar current switching approach, accurate control of the propagation delay through the divider and feedback chains is ensured with proportional to absolute temperature biasing. Such biasing ensures near constant delay by allowing the bias current to vary proportional to temperature variation. Instead of having propagation delay dependent upon supply voltage, temperature, and process variations, as is the case in a single ended CMOS implementation, supply and temperature dependencies are eliminated with these circuits due to biasing. Since the illustrated circuit provides precise, fast slew rates, the circuits can be operated at much lower currents than in prior art designs.

While a particular embodiment of the present invention has been shown and described, modifications may be made. It is therefore intended in the appended claims to cover all such changes and modifications which follow in the true spirit of and scope of the invention.

We claim:

1. A prescalar comprising:
   a first frequency divider configured to receive an input signal at an input frequency;
   a phase rotator coupled to the first frequency divider to produce a pluality of signal phases in response to the input signal;
   a one-hot decoder to select one signal phase of the plurality of signal phases;
   a feedback circuit coupled between the phase rotator and the one-hot decoder; and wherein the phase rotator comprises plurality of differentially coupled transistor pairs, each respective transistor of the plurality of transistor pairs being coupled to a respective output of a differential output of the phase rotator.

2. The prescaler of claim 1 wherein the one-hot decoder comprises a register having a plurality of data storage circuits, each data storage circuit being associated with a signal phase of the plurality of signal phases.

3. The prescaler of claim 1 wherein the one-hot decoder comprises a chain of frequency dividers.

4. The prescaler of claim 3 wherein the chain of frequency dividers comprises:
   a plurality of flip flop circuits, each flip flop circuit being associated with a signal phase of the plurality of signal phases.

5. The prescaler of claim 4 wherein each flip flop circuit is clocked in response to a signal from the feedback circuit.

6. The prescalar of claim 1 wherein the one-hot decoder comprises:
   a plurality of series coupled flip flop circuits clocked in response to an output signal of the prescalar.

7. The prescaler of claim 6 further comprising a level shifter circuit coupled between the plurality of flip flop circuits and the plurality of differentially coupled transistor pairs.

8. A prescalar comprising:
   a first frequency divider configured to receive an input signal;
   a phase rotator coupled to an output of the first frequency divider, the phase rotator producing four quadrature phase signals in response to the input signal and for selecting one of the four quadrature phase signals in response to a control signal;
   a frequency control circuit coupled to the phase rotator, said frequency control circuit comprising a plurality of data storage locations for storing data corresponding to the one of the four quadrature phase signals to be selected, including four series coupled latches, each latch being clocked by a clocking signal responsive to the output signal, each latch corresponding to a predetermined phase signal of the four quadrature phase signals; and
   a feedback circuit for providing an output signal, the feedback circuit coupled between the phase rotator and the frequency control circuit.

9. The prescalar of claim 8 wherein each latch of the plurality of series coupled latches comprises:
   at least one of a set input and a reset input for establishing an initial state of the frequency control circuit.

10. The prescaler of claim 9 wherein the phase select circuit comprises:
    four differentially coupled transistor pairs, each transistor pair corresponding to a predetermined phase signal of the four quadrature phase signals, each respective transistor of each transistor pair having an output terminal coupled with an output of the phase select circuit.

* * * * *